United States Patent
Mittal et al.

(10) Patent No.: US 7,230,550 B1
(45) Date of Patent: Jun. 12, 2007

(54) LOW-COMPLEXITY BIT-ROBUST METHOD AND SYSTEM FOR COMBINING CODEWORDS TO FORM A SINGLE CODEWORD

(75) Inventors: Udar Mittal, Hoffman Estates, IL (US); James P. Ashley, Naperville, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 11/383,506

(22) Filed: May 16, 2006

(51) Int. Cl.
    *H03M 5/00* (2006.01)
(52) U.S. Cl. .......................................... 341/55; 341/58
(58) Field of Classification Search .................. 341/58, 341/55, 59; 360/51; 708/650
    See application file for complete search history.

(56) References Cited

U.S. PATENT DOCUMENTS

| | | | |
|---|---|---|---|
| 4,760,378 A * | 7/1988 | Iketani et al. | 341/59 |
| 4,761,758 A * | 8/1988 | Deczky et al. | 708/650 |
| 5,627,694 A * | 5/1997 | Ido et al. | 360/51 |
| 5,633,632 A * | 5/1997 | Ido et al. | 341/58 |
| 6,141,638 A | 10/2000 | Peng et al. | |
| 6,236,960 B1 | 5/2001 | Peng et al. | |
| 6,662,154 B2 | 12/2003 | Mittal et al. | |

OTHER PUBLICATIONS

Mittal, Udar et al.: "Coding Unconstrained FCB Excitation Using Combinational and Huffman Codes", Proceedings IEEE Workshop on Speech Coding, Oct. 2002, pp. 129-131.
Ashley, James P. et al.: "Wideband Coding of Speech Using a Scalable Pulse Codebook", Proceedings IEEE Workshop on Speech Coding 2000, Lake Delevan, WI, Sep. 2000, pp. 148-150.
Hung, Andy C. et al.: Error-Resilient Pyramid Vector Quantization for Image Compression, IEEE Transactions on Image Processing, vol. 7, No. 10, Oct. 1998, pp. 1373-1386.
Fischer : "A Pyramid Vector Quantizer", IEEE Transactions on Information Theory, vol. IT-32, Jul. 1986, pp. 568-583.

* cited by examiner

*Primary Examiner*—Jean Bruner Jeanglaude (57) ABSTRACT

A system (100) and method (200) of combining codewords is provided. The system can include a splitter (120) for splitting a first codeword (110) into a most significant bits part MSP (112) and a least significant bits part LSP (114), a combiner (130) for combining the MSP of the first codeword with a second codeword to produce a first group (132), and a concatenator (140) for concatenating the first group with the LSP to produce a second group (134), and multiplexing the first group with the second group to produce a multiplexed codeword (150). Bit-errors in the LSP correspond to decoding errors only in a codeword associated with the LSP, and not to decoding errors in other codewords.

22 Claims, 4 Drawing Sheets

MSP: Most Significant Bits Part
LSP : Least Significant Bits Part

LOW-COMPLEXITY BIT-ROBUST METHOD AND SYSTEM FOR COMBINING CODEWORDS TO FORM A SINGLE CODEWORD

FIELD OF THE INVENTION

This invention generally relates to encoding and decoding an information signal. In particular, the invention relates to a method for information signal encoding and decoding using combinatorial and concatenation codes.

BACKGROUND

Methods for coding an information signal form the basis for a significant amount of speech, audio, image and video transmissions through communication channels or from storage devices. Digital speech encoding standards for code division multiple access (CDMA) mobile phone systems, for example, are described in the approved specification (ANSI/TIA/EIA-95-B-1999) entitled "Mobile Station—Base Station Compatibility Standard for Wideband Spread Spectrum Cellular Systems" (1999), published by the Electronic Industries Association (EIA), 2500 Wilson Blvd., Arlington, Va., 22201. A variable rate speech codec, and specifically a Code Excited Linear Prediction (CELP) codec for use in communication systems compatible with IS-95, is defined in the document (TIA/EIA/IS-127) entitled "Enhanced Variable Rate Codec, Speech Service Option 3 for Wideband Spread Spectrum Digital Systems" (1997), published by the Electronics Industries Association (EIA), 2500 Wilson Blvd., Arlington, Va., 22201.

A method for encoding a speech signal using factorial packing (FP) is described in "Factorial Packing Method and Apparatus for Information Coding", U.S. Pat. No. 6,236,960 by Peng et al., issued May 22, 2001. This speech coder utilizes four characteristics to uniquely describe any given pulse combination: number of degenerate pulses, signs of pulses, positions of non-zero pulses, and pulse magnitudes. A four-stage iterative classification of the pulse combination is performed, starting with the number of non-zero pulses and then determining the remaining parameters. The most significant bits in FP have most of the information about the number of non-zero pulses, while the least significant bits have primarily sign information showing a partial segregation of constituent information in FP. There is no complete segregation in this method, and therefore an error in the central bits does not always ensure that the number of degenerate pulses can be decoded correctly.

The pyramid vector quantization (PVQ) method, as described by Fischer, "A Pyramid Vector Quantizer", IEEE Transactions on Information Theory, Vol. IT-32, July 1986, pp. 568-583, is an example of an enumeration method. The enumeration technique may be very sensitive to bit errors. Hung et al., in the article "Error-Resilient Pyramid Vector Quantization for Image Compression", IEEE Transactions on Image Processing, Vol. 7, October 1998, pp. 1373-1386, proposed some PVQ enumeration methods that are less sensitive to bit errors than those proposed by Fischer. Two of their proposed enumeration methods, Conditional Product Code (CPC) and Conditional Product-Product Code (CPPC), were found to be robust to bit errors when used for representing Discrete Cosine Transform (DCT) coefficients in image compression. FP may be considered a variant of CPC. FP and CPC achieve robust performance by "partial segregation" of information present in a pulse configuration. The CPPC method has more segregation of constituent information, although it also does not ensure complete segregation. The comparisons between CPPC and CPC indicate that the CPPC method may be more robust to bit errors, suggesting that increasing information segregation may increase robustness. With complete information segregation, none of the bits in the codeword is affected by more than one of the constituents. It would be preferred that addition and multiplication functions would not be used to combine constituent codewords into a complete codeword, as these operations may add to the complexity of the coding process, and also tend to decrease segregation. The codeword should be formed by a concatenation of the constituent codewords, thus maintaining complete information segregation for higher error resilience.

A method for coding an information signal based on parameters inherent to the information signal is described in "Method and Apparatus for Coding an Information Signal", U.S. Pat. No. 6,141,638, W. Peng and J. Ashley, issued Oct. 31, 2000. The method selects one of a plurality of configurations based on predetermined parameters related to the information signal, each of the plurality of configurations having a codebook; and searches the codebook over the length of an excitation vector which is shorter than a sub-frame length, to determine a codebook index from the codebook corresponding to the selected configuration; and transmits the predetermined parameters and the codebook index to a destination.

A code-excited linear prediction (CELP) technique is described in the paper by James P. Ashley, Edgardo M. Cruz-Zeno, Udar Mittal and Weimen Peng, "Wideband Coding of Speech Using a Scalable Pulse Codebook", Proceedings IEEE Workshop on Speech Coding 2000, Lake Delavan, Wis., September, 2000. The technique is scalable to a wide range of bit rates. The method improves the coding efficiency of multiple pulse ACELP tracks in wideband speech coding. The method was also shown to be extendable beyond Algebraic Code-Excited Linear Predictive (ACELP) speech coders, such that the standard track constraints are eliminated while still achieving high quality speech.

A method for coding "unconstrained" fixed codebook (FCB) excitation for ACELP speech coders is described in the paper by Udar Mittal, James P. Ashley and Edgardo M. Cruz-Zeno, "Coding Unconstrained FCB Excitation Using Combinatorial and Huffman Codes", Proceedings IEEE Workshop on Speech Coding, October 2002. The unconstrained FCB does no place track-based constraints on the pulse positions. The coding method combines Huffman codes and combinational codes. The method is less sensitive to bit errors and is nearly as efficient as the combinational codes. The method includes efficiently storing the parameters in the combinational codebook.

Methods such as Pyramid Vector Quantization (PVQ) and Huffman Coded Factorial Packing (HCFP) are prior art techniques remove the multiply and divide operations during the formation of a codeword during encoding for representing the fixed codebook (FCB) excitation. In one aspect, the methods concern the formation of codeword for representing the FCB excitation having reduced bit error sensitivity. These methods reveal that removing the multiply and divide operations can result in a codeword having bit segregation property with less computational complexity and improved bit error sensitivity. For example, a single shift operation in PVQ can be used instead of a multiply operation. The operative aspects of PVQ and HCFP can improve the bit error robustness at an expense of using 1 or 2 bits more than the minimum bits required to form the codeword for the fixed codebook excitation. However, these methods do not address combination of constituent codewords belonging to a set such that the constituent codewords can be uniquely decoded from the combined codeword.

The prior art methods for efficient coding can include either combinational techniques or concatenation techniques. A combinational coding technique can combine and decombine two or more long codewords to form a combined codeword which generally involves a multi-precision multiply and/or divide operation. The multi-precision operations can be computationally demanding with excess precision and can result in high-bit error sensitive combined codewords. A concatenation method can append two or more long codewords together to form a combined codeword which generally does not require multiply and divide operations. However, the concatenation technique generally requires more bits than the combinational technique and is not as efficient with regard to the number of bits required to represent the combined codeword.

It is an object of this invention, therefore, to improve upon the computational complexity of combinational and concatenation coding and decoding, to provide higher efficiency and error resiliency associated with factorial packing methods and Huffman coding factorial packing methods, and to overcome the deficiencies and obstacles described above.

BRIEF DESCRIPTION OF THE DRAWINGS

The features of the system, which are believed to be novel, are set forth with particularity in the appended claims. The embodiments herein, can be understood by reference to the following description, taken in conjunction with the accompanying drawings, in the several figures of which like reference numerals identify like elements, and in which:

DETAILED DESCRIPTION

While the specification concludes with claims defining the features of the embodiments of the invention that are regarded as novel, it is believed that the method, system, and other embodiments will be better understood from a consideration of the following description in conjunction with the drawing figures, in which like reference numerals are carried forward.

As required, detailed embodiments of the present method and system are disclosed herein. However, it is to be understood that the disclosed embodiments are merely exemplary, which can be embodied in various forms. Therefore, specific structural and functional details disclosed herein are not to be interpreted as limiting, but merely as a basis for the claims and as a representative basis for teaching one skilled in the art to variously employ the embodiments of the present invention in virtually any appropriately detailed structure. Further, the terms and phrases used herein are not intended to be limiting but rather to provide an understandable description of the embodiment herein.

The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "suppressing" can be defined as reducing or removing, either partially or completely. The term "processing" can be defined as number of suitable processors, controllers, units, or the like that carry out a pre-programmed or programmed set of instructions.

The terms "program," "software application," and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Embodiments of the invention can involve a method of combining codewords. The method can include splitting a first codeword into a most significant bits part (MSP) and a least significant bits part (LSP), combining the MSP of the first codeword with a second codeword to produce a first group, and multiplexing the first group with the LSP to produce a multiplexed codeword. In another arrangement, the method can further include splitting one or more additional codewords for producing one or more MSPs and one or more LSPs, combining a MSP of the first codeword with the one or more MSPs of the one or more additional codewords for producing a first group, concatenating a LSP of the first codeword with the one or more LSPs of the one or more additional codewords for producing a second group, and multiplexing the first group and the second group to form the multiplexed codeword.

In one aspect, a bit-length for the first group and a bit-length of the second group can be precomputed to reduce a computational complexity and increase a bit-error robustness of the combining codewords. The precomputing can include determining a number of codewords to include in the first group, determining a number of most significant bits (MSBs) in the codewords, computing a plurality of maximal values for the MSPs of the first group based on the MSBs, multiplying together the plurality of maximal values for producing a product, and determining a bit-length of the product. A bit-length of the multiplexed codeword can be set equal to or less than a combined bit-length by selecting the bit-length for the one or more MSPs. For example, a bit-length for the one or more MSPs can be selected that minimizes a bit-length of the first group to reduce a computational complexity and reduce bit-sensitivity.

A higher proportion of error protection can be assigned to the first group than the second group to reduce bit-sensitivities. One advantage of the method is that bit-errors in the second group only correspond to decoding errors in a codeword associated with the LSP of the second group. That is, any bit-errors in the LSPs do not affect the decoding of other codewords. Embodiments of the invention also concern a method of factorial packed coding. The method can include splitting a first $C\pi$ into a $C\pi$ MSB part and a $C\pi$ LSB part, splitting a first $C\mu$ into a $C\mu$ MSB part and a $C\mu$ LSB part, combining the $C\pi$ MSB part and the $C\mu$ MSB part from one or more factorial packed codewords into a first group, concatenating the $C\pi$ LSB part and the $C\mu$ LSB part with $C\sigma$ from the one or more factorial packed codewords to produce a second group, and combining the first group and the second group with a Cv to form a combined factorial packed codeword. Huffman Coding can be employed to generate the one or more factorial packed codewords.

The method can further include calculating a maximal value for both the Cπ MSB and the Cμ MSB for the plurality of factorial packed codewords, and multiplying together the maximal values of the plurality of factorial packed codewords to produce a first portion of Cv. The first portion of Cv can be multiplied by left shift by a number of bits corresponding to the bit-length of the second group. In one aspect, a bit-length of the Cπ LSP and a bit-length of the Cμ LSP can be included in a power term providing the left shift. An advantage of the shifting is that bit-errors in the LSPs of the second group do not result in erroneous decoding of one or more of the non-zero pulse positions.

Embodiments of the invention can concern a method and system for the efficient combination and de-combination of two or more long codewords to form a single combined codeword. The method provides a reduction in the number of multi-precision multiply and divide operations to reduce the computational complexity and the sensitivity of the combined coding bit-errors. The method and system combine codewords by first splitting codewords into a Most Significant Bits (MSB) part and a Least Significant Bits (LSB) part. The combined codeword is then formed by combining the MSB parts of each of the codewords using short length multiply operations and then concatenating the combination with the LSB parts of the codewords. This method requires lower-precision operations and is less sensitive to bit errors than either combinational coding or concatenative coding.

Figure 1:
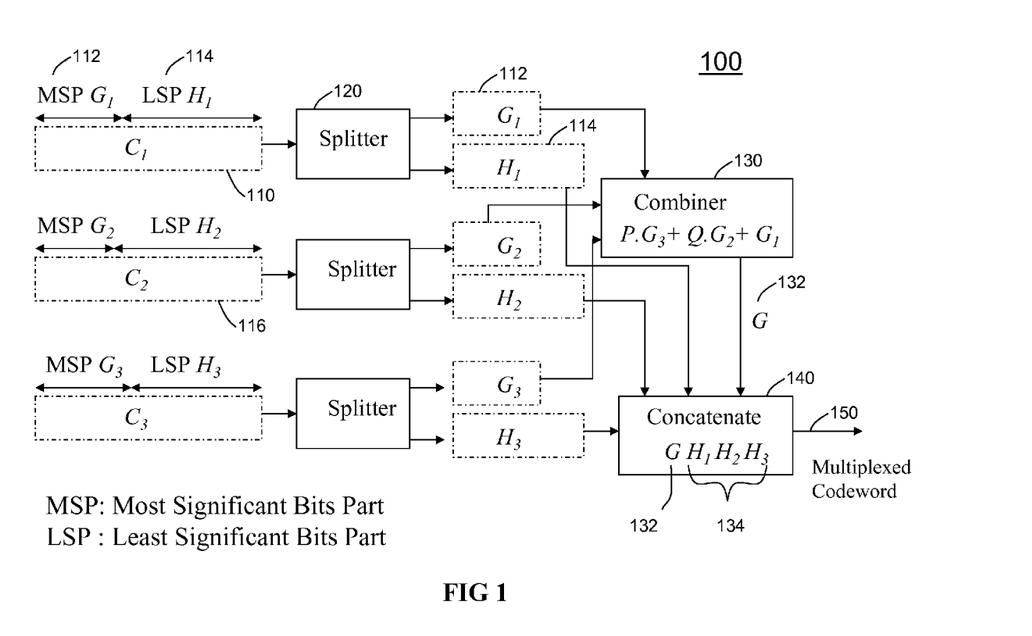
FIG. 1 is a schematic diagram for a multiplex coder in accordance with the invention.

Referring to FIG. 1, one embodiment of a multiplex coder 100 for multiplexing codewords to form a single codeword is shown. The multiplex coder 100 can include one or more splitters 120 for partitioning a bit sequence of a codeword 110 into a most significant bits part (MSP) 112 and a least significant bits part (LSP) part 114, a combiner 130 for combining the MSB 112 of the first codeword 110 with the MSPs of one or more codewords 116, and a concatenator 140 for concatenating a LSP part 114 of the first codeword 110 with the LSPs of the second codeword 116, for producing a second group 134. The concatenator also multiplexes the second group 134 with the first group 132 to form a multiplexed codeword 150. The multiplexing can be a shuffling or scrambling operation. The splitting can be applied to one or more codewords in a plurality of codewords $C_1, C_2 \ldots C_M$ for producing one or more MSPs and one or more LSPs. For example, the MSB 112 of the first codeword 110 can be combined with the or one or more MSBs of the one or more codewords for producing the first group 132. In the particular example of FIG. 1, three codewords $C_0, C_1, C_2$ are combined to produce one multiplexed codeword 150. Notably, more or less than the number of codewords shown can be used to generate the combined codeword.

The MSP 112 of a codeword 110 can correspond to a most significant bit portion, and the LSP 114 can correspond to a least significant bit portion. For example, the codeword 110 can be represented by a sequence of bits which represent a value of the codeword. For example, the codeword may be a 16-bit value representing a filter coefficient of speech. The bit-size of the MSP 112 and the LSP 114 can be precomputed to minimize a bit-length of the multiplexed codeword 150. For example, the bit-length of the multiplexed codeword 150 can be selected to be equal to or less than the bit-length of a combined codeword. A combined codeword is a codeword generated from either a combinational coder or a concatenation coder.

Briefly, an implementation of a concatenation coder is presented. Consider, a prior art compression technique which produces M codewords $C_1, C_2, \ldots, C_M$ of lengths $I_1, I_2, \ldots, I_M$, respectively. Let $C_i$ take values between 0 and $C_i^{max}-1$, i.e., $C_i^{max}$ is defined to be one more than the maximum value of $C_i$. If the combined codeword is formed by concatenating together all the codewords then the total number of bits in the combined codeword are $L=l_1+l_2+\ldots+l_M$. Understandably, a concatenation coder concatenates bit sequences of one or more codewords to produce a combined codeword. The bit-length sequence of the combined codeword has a length corresponding to the sum of the bit-lengths of the codewords used in creating the combined codeword.

Briefly, an implementation of a combinational coder is presented. Consider a prior art encoder technique wherein the combined codeword is obtained from one or more codewords $C_M$ by EQ (1):

$$\Phi = \sum_{j=1}^{M} \left( \prod_{i=1}^{j-1} C_i^{max} \right) C_j. \quad (1)$$

where φ is the combined codeword that ranges between $$0 \text{ and } \left( \prod_{i=1}^{M} C_i^{max} \right) - 1.$$

Accordingly, the number of bits needed to represent φ is given by EQ (2):

$$L_\Phi = \left\lceil \log_2 \left( \prod_{i=1}^{M} C_i^{max} \right) \right\rceil \quad (2)$$

which may be less than L, the number of bits of the concatenated codeword. In practice, the combined codewords can be sent over a communication channel which can be decoded to produce information represented by the original codewords. The original codewords, $C_1 \ldots C_M$, can be obtained from the combined codeword, EQ (1), from an iterative decoding process. The encoding can require M multiply operations and the decoding can require M divide operations, yielding a total of 2M operations. This may not be a concern when the lengths $I_i$ of the constituent codewords $C_i$ are small. However, $I_i$ may be large (larger than 40 bits) for codewords in certain situations which can require a significant computational processing requirements. EQ (1) is a bit efficient coding method for creating combined codewords that requires multi-precision divide and multiply operations. However, a bit error at any location of the combined codeword using EQ (1) may result in decoding error in several or all of the constituent codewords $C_1 \ldots C_M$, making the method very sensitive to bit errors.

Figure 2:
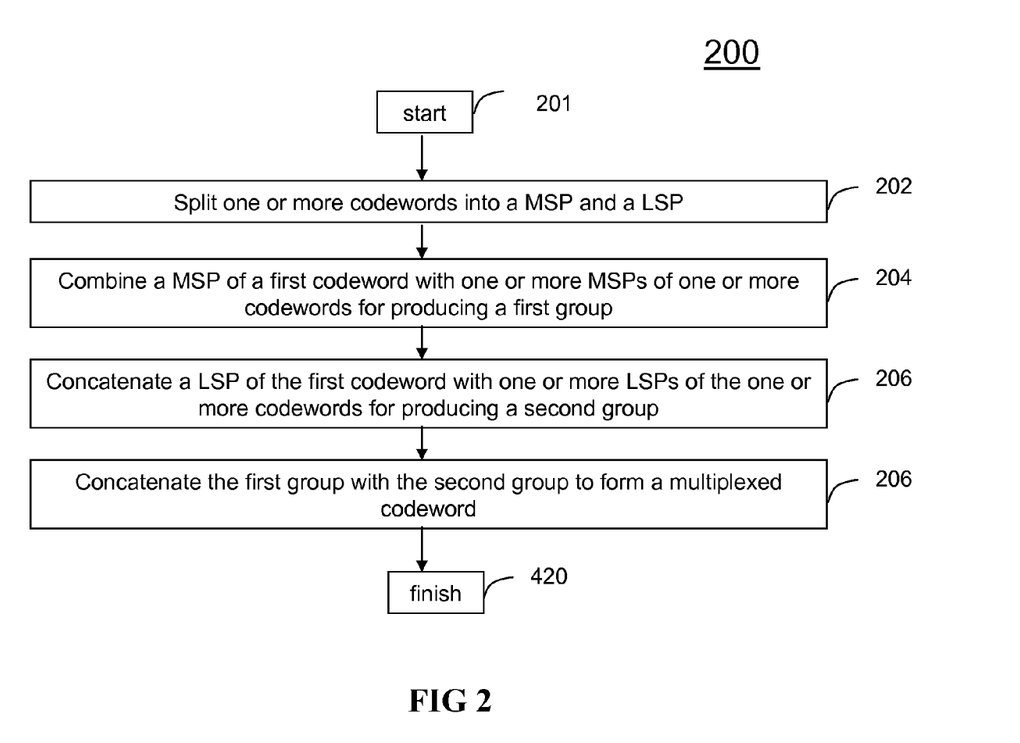
FIG. 2 is a flow chart for a method of combining codewords to form a single codeword in accordance with the invention.

Referring to FIG. 2, a method 200 of multiplexing one or more codewords to produce a multiplex codeword that overcomes the bit error sensitivities of EQ (1) is shown. The method 200 may include more than or fewer than the number of steps shown. Reference will be made to FIG. 1 for describing the method 200. The method 200 of multiplexing incorporates operative aspects of combination coding and concatenation coding. The method 200 provides a more robust method for reducing bit error sensitivities.

At step 201, the method can start. At step 202, one or more codewords can be split into a MSP and a LSP. For example, referring to FIG. 1, codewords $C_1$, $C_2$, and $C_3$ can be split into one or more MSPs and LSPs. For instance, $C_1$ can be split into a MSP 112 of MSBs (most significant bits) and a LSP 114 of LSBs (least significant bits). MSB parts ($G_i$) and LSB parts ($H_i$) can be defined for each of the M codewords $C_1, C_2, \ldots, C_M$, and having lengths $g_i$ and $h_i$, respectively. Note that $h_i = I_i - g_i$ and $G_i^{max}$ is the number of possible values of $G_i$. For example, if 5 bits are selected for the MSB part, and $G_1^{max}=21$, $G_2^{max}=31$, and $G_3^{max}=17$, and If the codewords are 16-bits, then the remaining 11 bits are assigned to the LSB.

At step 202, a MSP of a first codeword can be combined with a second codeword for producing a first group. For example, the MSB part $G_1$ can be combined with $G_2$ and $G_3$ for each of the codewords and represented as a first group, $\Gamma$. Notably, $\Gamma$ can be formed by a combination of the $G_i$ similar to the combination of the $C_i$ in EQ (1), as shown in EQ (3), $$\Gamma = \sum_{j=1}^{M} \left( \prod_{i=1}^{j-1} G_i^{max} \right) G_j, \qquad (3)$$

At step 204, a LSP of the first codeword can be concatenated with one or more LSPs of the one or more codewords for producing a second group. The concatenation can include scrambling the order of the LSPs or a consecutive ordering of the LSPs but is not herein limited to these. For example, referring to FIG. 1, the LSB part can be formed by a consecutive ordering of $H_i$'s as shown in EQ (4), $$H = [H_1 H_2 \ldots H_M] \qquad (4)$$

At step 206, a LSP of the first codeword can be concatenated with the second codeword for producing a second group, 134. In practice, the concatenation can include scrambling or shuffling the parts of the multiplexed codeword, $\phi_{mx}$. The multiplexed codeword can be formed by concatenating the first group 132 and the second group 134, wherein the first group 132 is a combined MSB portion and the second group 134 is a concatenated LSB portion. In particular, the first group 132 is a combined codeword and the second group 134 is a concatenated codeword. That is, the multiplexed codeword $\phi_{mx}$ can be formed by a concatenation of $\Gamma$ and H as shown in EQ (6), $$\phi_{mx} = [\Gamma H] \qquad (5)$$

This first group 132, $\Gamma$, is the MSB portion (MSP), and the second group 134, H, is the LSB portion (LSP) of the multiplexed codeword, $\phi_{mx}$. The length of the combined codeword can be given by EQ(6), $$L_{\phi mx} = L_\Gamma + L_H = \left\lceil \log_2 \left( \prod_{i=1}^{M} G_i^{max} \right) \right\rceil + \sum_{i=1}^{M} h_i. \qquad (6)$$

In practice, a $g_i$ that satisfies $g_i \leq I_i$ can be chosen as the length of $G_i$. However, in order to have lower complexity and to have a better bit error robustness, $g_i$ is chosen such that the length $L_\Gamma$ in EQ (6) is minimum and length $L_{\phi mx}$ in EQ (6) and $L_\phi$ in EQ (2) are identical. Notably, any bit errors belonging to $H_i$ during the formation of the multiplexed codeword in steps 202-208 are confined to erroneous decodings in the respective codeword, $C_i$. That is, bit errors in the LSB part of one particular codeword correspond to decoding errors in only that codeword. The other remaining codewords are decoded without error. This is one particular advantage of the method 200 over prior art methods; namely, the increased segregation and reduced sensitivity to bit errors. Any bit errors in bits belonging to $H_i$ will only result in wrong decoding of the constituent codeword $C_i$ without affecting the decoding of any of the other M−1 constituent codewords.

Referring back to FIG. 1, the combiner 130 provides the mathematical realization of EQ (3). In particular, each $G_i$ is weighted by a product of $G_i^{max}$. The weight for each $G_i$ is the inner loop multiplication of the previous (j—1) $G_i$ maximum values. In practice, M−1 codewords 110 are included in a weighting of a first part $G_i$, a maximal value $G_i^{max}$ for the first part of each of the codewords is calculated, and the maximal values for the past codewords are multiplied together for producing a first weight associated with the first part. The steps can be repeated for producing one or more weights associated with the one or more first parts. For example, based on EQ (3), $G_1$ can have a unitary weighting, $G_2$ can have a weighting of Q, and $G_3$ can have a weighting of P as shown in FIG. 1.

Notably, the combiner 130 can multiply the MSP of each codeword by the corresponding weight for producing a weighted part, and respectively multiplying the one or more weights of the one or more codewords with the one or more MSPs for producing one or more weighted parts. The combiner 130 can add the first weighted part and the one or more weighted parts to produce the first group 132. For example, referring to FIG. 1, the combiner can add the weighted parts $PG_3+PG_2+G_1$ to produce a complete most significant bits group; that is, the first group 132, G.

The concatenator 140, can concatenate the LSPs of the one or more codewords to produce the second group 134, H. The concatenator 140, can include bit-shifting logic to shift the designated least significant bits part (LSP) from each of the M codewords into a complete least significant bits group; that is, the second group 134, H. The concatenator 140 can concatenate the first group 132, G, with the second group 134, H, to produce the multiplexed codeword 150, $\phi_{mx}$. The concatenator 140, can shuffle or scramble the arrangement of the first group and the second group, including the ordering of the second parts within the second group.

In the foregoing, an example of the method 200 is briefly presented in contrast to the conventional concatenation coding and conventional combinational coding. The example is provided in the context of a CELP based speech coding system. The inventive aspects are not herein limited to CELP coding and can be applied to other forms of speech coding such as AMR, AMBE, VSELP, ACELP, and the like. A speech frame of length 160 samples (20 ms) can be divided into 3 subframes of length 53, 53, and 54 samples. A factorial packing method is used to code the FCB excitation in each of the three subframes. For example, a 6 pulse factorial packing codebook is used for the coding purposes. The number of bits to code an FCB excitation using a 6 pulse factorial packing codebook in the three subframes is determined from a table to be 31, 31, and 32 bits, respectively. That is, the three codewords $C_1$, $C_2$ and $C_3$ (110) are of length 31, 31, and 32. Directly concatenating the three codewords using a concatenational coder requires 94 bits. Alternatively, a combinational coder such as that described in EQ (1) can generate a uniquely decodable codeword using 93 bits. However, the combinational method requires 93 bit multiplications during encoding and 93 bit divisions during decoding.

A precomputed bit-length $L_\Gamma=23$ can be selected which leaves a bit-length of $L_H=70$. A total multiplexed bit-length $L_{\phi mx}=23+70=93$ equals the combined bit-length. $G_1$, $G_2$, and $G_3$ can be defined as the most significant 8 bits of $C_1$, $C_2$ and $C_3$ and EQ (3) can be applied to combine $G_1$, $G_2$, and $G_3$ to form $\Gamma$. Note that $G_1^{max}=G_2^{max}=EC$ and $G_3^{max}=84$. Substituting these values of $G_i^{max}$ in EQ (6), one can see that $L_\Gamma=23$, $L_H=70$, and $L_\phi=93$. Thus, the method 200 can code the constituent codewords into a uniquely decodable multiplexed codeword which requires only 93 bits. Furthermore, only 24 bit multiplication and 24 bit division are required in the method 200 instead of the 93 bit multiplication and 93 bit divisions required in a combinational coding.

In addition, any single bit error in the $L_H=70$ bits representing H will result in erroneous decoding of only one of the constituent codeword. Notably, a bit-error in a second part of a codeword only causes an error in the decoding of that codeword. The erroneous decoding is limited to the constituent codeword. However, a single bit error in first $L_\Gamma=23$ bits may still result in erroneous decoding of all the constituent codewords. Consequently, a higher allocation of bit-error protection can be applied to the more sensitive bits in systems where unequal error protection is desired. For example, the 23 bits of the first group can be chosen to have better error protection than the 70 bits of the second group.

Figure 3:
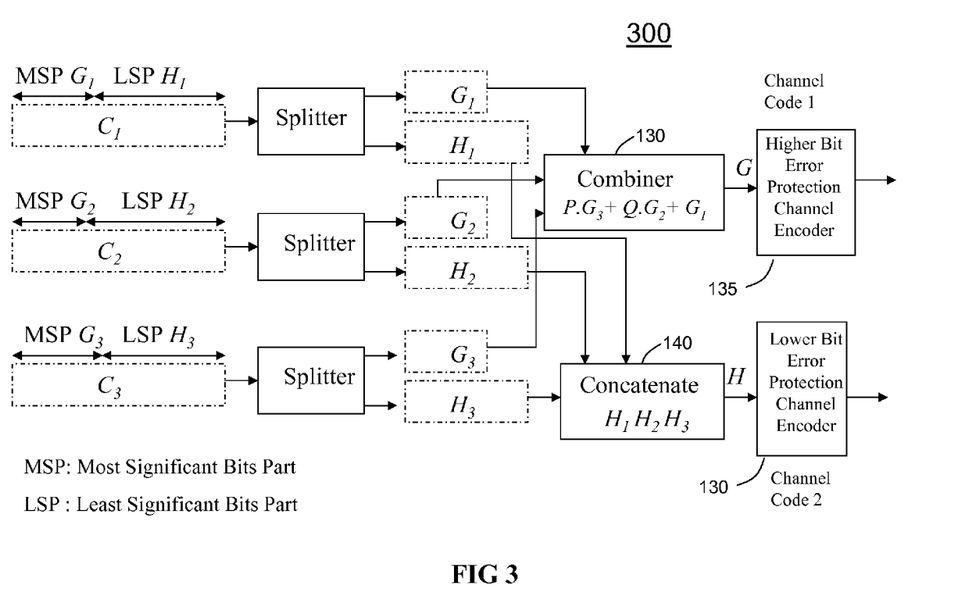
FIG. 3 is a schematic diagram of the multiplex coder of FIG. 1 providing error protection in accordance with the invention.

Referring to FIG. 3, another embodiment of a multiplex coder 100 for multiplexing codewords to form a single codeword is shown. The multiplex coder 100 can include error protection to decrease coding errors on selected bits. A first error protection unit 135 can be coupled to the output of the combiner 130 for protecting the first group 132, G. A second error protection unit 145 can be coupled to the output of the concatenator 140 for protecting bits of the second group 134, H. The first error protection unit 135 and the second error protection unit 145 can be the same unit, and are shown as distinct units for purposes of illustration. The error protection unit can be directly applied to the multiplexed codeword or to stages involved with the multiplexing for applying error protection.

For example, the first group 132 can be allocated higher error protection than the second group. As previously discussed, a bit error in a second part of the second group results in an erroneous decoding only for the codeword associated with the second part. However, a bit error in a first part of the first group can result in erroneous decoding for the set of M codewords. Accordingly, higher error protection can be applied to the first group that the second group to limit the erroneous decoding of more than one codewords. For example, if only 3 bits of protection are provided, and the first part (MSB) of each codeword is 3 bits, then all the protection can be applied to the first group to ensure that erroneous decodings are limited to single codewords.

Figure 4:
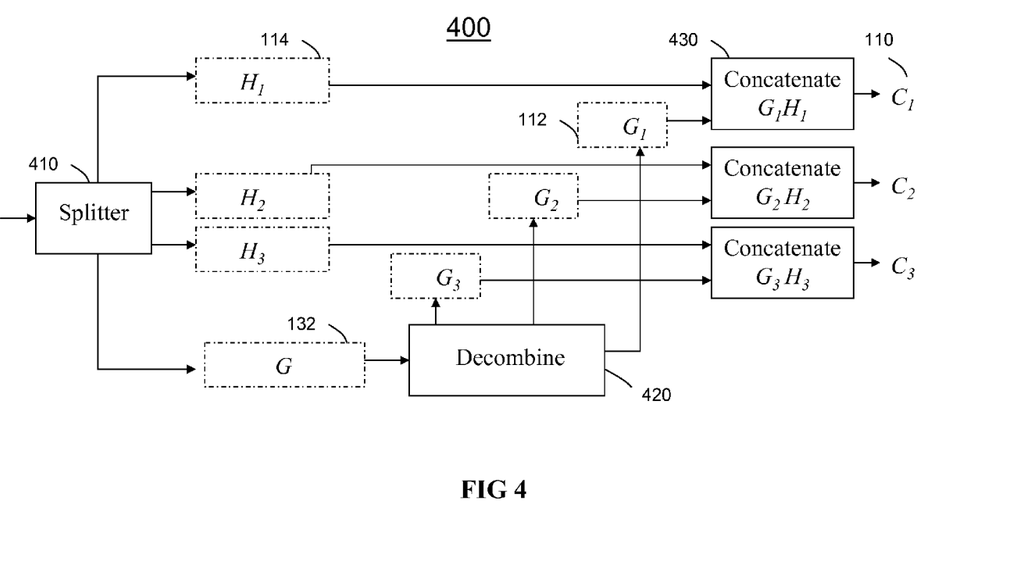
FIG. 4 is a schematic diagram for a multiplex decoder in accordance with the invention

Referring to FIG. 4, a decoder 400 for decoding a multiplexed codeword is shown. The decoder 400 can include a splitter 410 for partitioning a multiplexed codeword into a first group and one or more LSPs, a decombiner 420 for partitioning the first group into one or more MSBs, and one or more concatenate units 430 for concatenating the one or more first parts with the one or more second parts. For example, a multiplexed codeword 150 can be received by a device hosting the decoder 400. The device can be a radio, a cell phone, a communications device or any other device capable of receiving a multiplexed codeword. The device can include a radio frequency modulation unit for extracting the multiplexed codeword from a communications signal. The splitter 410 can split the codeword into the first group, G 132, and the LSPs $H_1$, $H_2$, $H_3$ of the second group H, 134 The decombiner 132 can partition the first group, G 132, into one or more MSBs $G_1$, $G_2$, $G_3$ of the one or more code words $C_1$, $C_2$, $C_3$. The concatenate units 420 can concatenate each MSB 112 with a corresponding LSP 114 for producing the codeword 110.

In one arrangement, a Code Excited Linear Predictive (CELP) speech coding system employing a factorial packing (FP) method can be considered for coding a fixed codebook (FCB) excitation of a speech signal in accordance with the invention. Though not herein limited, the speech signal can represented as an excitation signal and a source signal. The source signal can represent changes of the speech spectral envelope, and the excitation can represent the fine spectral envelope, such as the pitch. As is known in the art, the excitation sequence can be represented by a series of pulses spaced at intervals corresponding to the pitch of the spoken voice. The pulse excitation parameters can include the number of pulses, the sign of the pulses, the position of the pulses, and the magnitude of the pulses. The factorial packing method can encode a fixed codebook excitation by representing the excitation as a combined sequence of these pulse parameters. In practice, the number of factorial packing codewords depends on the number of subframes in a speech frame. For example, a speech frame can be represented by three or four factorial packing codewords. The length of these codewords can be between 35 to 60 bits. Combining the factorial packing codewords of all the subframes of a given frame to form a single combined codeword may require multi-precision (precision of 100 bit or more) multiply and divide operations. These operations can be complex and can result in a combined codeword that may more sensitive to bit errors. Accordingly, the method 200 can be employed to reduce the number of multi-precision multiply and divide operations.

Briefly, an implementation of a Factorial Packing is presented. Factorial packing is an efficient method of representing FCB excitation wherein the FCB excitation is coded using a fixed number of unit magnitude pulses. In practice, any combination of unit magnitude pulses on a given subframe of length (n) can be described by the following basic properties: (i) Number of non-zero or occupied positions (v), (ii) Location of non-zero positions in track ($\pi$), (iii) Magnitude or number of unit magnitude pulses in each non-zero position ($\mu$), and (iv) Signs of pulses in non-zero positions ($\sigma$). Let F(n, v) be the combinations of v non-zero positions in a subframe of length n and D(m, v) be the combinations of placing m unit magnitude pulses in v non-zero positions. The codeword $C_v$ for number of non-zero positions v is given by EQ (7):

$$C_v = \sum_{i=v+1}^{m} F(n, i) \cdot D(m, i) \cdot 2^i \qquad (7)$$

The factorial packing codeword is formed by first combining the codeword $C_\pi$ for position $\pi$, codeword $C_\mu$ for magnitude $\mu$, and codeword $C_\sigma$ for sign $\sigma$ using EQ (1). The combined codeword can be added with $C_v$ to form a factorial packing codeword. However, for large n, m, the lengths of $C_\pi$ and $C_\mu$ are sufficiently large and hence combining them may require multi-precision multiply and divide operations. Prior art methods such as PVQ and HCFP can avoid these multi-precision operations. However, these methods may require additional bits and are not as efficient as factorial packing. Accordingly, the method 200 can be extended for factorial packed codewords. The method can include the steps of determining a plurality of pulse parameters based on the sequence of pulses, and generating the combined codeword from one or more factorial packed codewords. Notably, embodiments of the invention herein concern combinations of codewords, which can be advantageously applied for the combination of $C_\pi$ and $C_\mu$ to generate a bit-error robust factorial packing codeword. The term combinations can include linear combinations and multiplexing.

In practice, $C_\pi$ and $C_\mu$ can be split into a most significant bits part MSP and a least significant bits part LSP. Both $C_\pi$ and $C_\mu$ will each have a MSP and an LSP. Since the length $l_\pi(v)$ and $l_\mu(v)$, of $C_\pi$ and $C_\mu$ and their maximum values $C_\pi^{max}(v)$ and $C_\mu^{max}(v)$ are dependent on v, the splitting will also depend on v. Note that $C_\pi^{max}(v)=F(n, v)$ and $C_\mu^{max}(v)=D(m, v)$. Let $G_\pi$ and $G_\mu$ be the MSB parts (MSP) of $C_\pi$ and $C_\mu$, and $g_\pi(v)$ and $g_\mu(v)$ be their respective lengths. Also $G_\pi^{max}(v)$ and $G_\mu^{max}(v)$ can be defined as the maximum of $G_\pi$ and $G_\mu$. Accordingly, the MSB parts $G_\pi$ and $G_\mu$ can be combined using EQ (3) and then concatenated with LSB parts along with codeword for sign, $C_\sigma$. The combined codeword thus formed is summed with the codeword for the number of non-zero positions, $C_v$. In particular, the codeword for v, is now given by EQ (8):

$$C_v = \sum_{i=v+1}^{m} G_\pi^{max}(i) \cdot G_\mu^{max}(i) \cdot 2^{i+h_\pi(i)+h_\mu(i)} \quad (8)$$

where $$h_\pi(v)=l_\pi(v)-g_\pi(v), h_\mu(v)=l_\mu(v)-g_\mu(v) \quad (9)$$

The number of bits required for the factorial packing codeword is given by EQ (10):

$$N = \left\lceil \log_2\left(\sum_{i=1}^{m} G_\pi^{max}(i) \cdot G_\mu^{max}(i) \cdot 2^{i+h_\pi(i)+h_\mu(i)}\right) \right\rceil \quad (10)$$

The length of the MSB part determines the complexity and the bit error sensitivity. The complexity and the coding process increase with an increase in the bit-length of the MSB. The bit error sensitivity also increases as the bit-length of the MSB increases. Accordingly, the length of the MSB parts are selected to be smallest such that the codeword length N obtained in EQ (10) is identical to the length of codeword in a standard factorial packing method.

Notably, $h_\pi(v)$ and $h_\mu(v)$ can be chosen to be a number not less than that one obtained in EQ (9) and provided that the bit-lengths do not increase the total bit-length, N, in EQ (10) for the computation of $C_v$ and N. This can improve bit segregation and can consequently improve error robustness. A further inspection of EQ (8) reveals how the choice of $h_\pi(v)$ and $h_\mu(v)$ can improve the bit segregation property. For example, the term $2^{i+h_\pi(i)+h_\mu(i)}$ in EQ (8) provides a left shift of $i+h_\pi(i)+h_\mu(i)$, thereby forcing the $i+h_\pi(i)+h_\mu(i)$ least significant bits in the summation of EQ (8) to be equal to zero. Thus, the power term includes a summation of a bit-length of the $C\pi$ LSB part and a bit-length of the $C\mu$ LSB part. That is, the first portion of Cv is multiplied by a power term of 2 to left shift the value of Cv by a number of bits corresponding to the bit-length of the second group.

Accordingly, $h_\pi(i)$ and $h_\mu(i)$ can be chosen such that the minimum value of $i+h_\pi(i)+h_\mu(i)$ over all i is as large as possible and N in EQ (10) does not increase. A metric can be defined to impose a limit on the bit-length of the factorial packed codeword as shown in EQ (11):

$$K = \max_{h_\pi, h_\mu} \left( \min_i (i + h_\pi(i) + h_\mu(i)) \right) \quad (11)$$

EQ (11) ensures that that N in EQ (10) does not increase. Accordingly, the choice of $h_\pi(v)$ and $h_\mu(v)$ will make $C_v$ independent of the K LSB bits. Hence, bit errors in K LSB bits will not result in erroneous decoding of v.

In another embodiment of the invention, Huffman Coding can be incorporated with the generating of the one or more factorial packed codewords to encode the number of non-zero positions. One of the motivations and benefits of using a Huffman code is the segregation of constituent information, with increased robustness to bit errors. In applications where error protection may be unequal, the bits may be classified into groups on the basis of their sensitivity to bit errors, and then may use better channel error protection for bits that are more sensitive, and less channel error protection for bits that are less sensitive. Huffman code bits may be sensitive to bit errors and use of shorter length Huffman codes may reduce the number of sensitive bits. A Huffman code is desirable in that the length of the longest Huffman code is smallest, and at the same time the length L of the complete codeword C is not lengthened.

Where applicable, the present embodiments of the invention can be realized in hardware, software or a combination of hardware and software. Any kind of computer system or other apparatus adapted for carrying out the methods described herein are suitable. A typical combination of hardware and software can be a mobile communications device with a computer program that, when being loaded and executed, can control the mobile communications device such that it carries out the methods described herein. Portions of the present method and system may also be embedded in a computer program product, which comprises all the features enabling the implementation of the methods described herein and which when loaded in a computer system, is able to carry out these methods.

While the preferred embodiments of the invention have been illustrated and described, it will be clear that the embodiments of the invention are not so limited. Numerous modifications, changes, variations, substitutions and equivalents will occur to those skilled in the art without departing from the spirit and scope of the present embodiments of the invention as defined by the appended claims.

What is claimed is:

1. A method of combining codewords comprising:
   splitting a first codeword into a most significant bits part (MSP) and a least significant bits part (LSP);
   combining a MSP of the first codeword with the one or more MSPs of the one or more codewords for producing a first group;
   concatenating a LSP of the first codeword with the one or more LSPs of the one or more codewords for producing a second group; and
   multiplexing the first group and the second group to form the multiplexed codeword.

2. The method for claim 1, further comprising:
de-splitting the multiplexed codeword into the first group and the second group, wherein the second group consists of the one or more LSPs;
de-combining the first group into the one or more MSPs;
concatenating the one or more MSPs with the one or more LSPs for producing the one or more codewords.

3. The method of claim 1, wherein the concatenating is one of a scrambling or shuffling operation.

4. The method of claim 1, further comprising precomputing a bit-length for the first group and a bit-length of the second group that reduces a computational complexity and increases a bit-error robustness of the multiplexed codeword.

5. The method of claim 4, wherein the precomputing a bit-length for the first group comprises:
determining a number of codewords to include in the first group;
determining a number of most significant bits (MSBs) in the codewords;
computing a plurality of maximal values for the MSPs of the first group based on the MSBs;
multiplying together the plurality of maximal values for producing a product; and
determining a bit-length of the product, wherein the bit-length corresponds to the bit-length of the first group.

6. The method of claim 5, further comprising:
selecting a bit-length for the one or more MSPs wherein the bit-length of the multiplexed codeword is equal to or less than a combined bit-length.

7. The method of claim 5, further comprising:
selecting a bit-length for the one or more MSPs that minimizes a bit-length of the first group,
wherein a bit-length of the multiplexed codeword is the sum of the bit-length of the first group and a bit-length of the second group.

8. The method of claim 7, wherein bit-errors in the LSP correspond to decoding errors in a codeword associated with the LSP.

9. The method of claim 1, further comprising assigning a higher proportion of error protection to the first group than the second group.

10. The method of claim 1, further comprising:
representing a speech signal by a sequence of pulses;
determining a plurality of pulse parameters based on the sequence of pulses;
generating one or more factorial packed codewords from the plurality of pulse parameters; and
generating the multiplexed codeword from the one or more factorial packed codewords,
wherein a factorial packed codeword has a first portion corresponding to a number of non-zero pulse positions, a second portion corresponding to a location of the non-zero pulse positions, a third portion corresponding to a number of unit magnitude pulses in each of the non-zero positions, and a fourth portion corresponding to the sign of the pulse in each of the non-zero positions.

11. The method of claim 10, wherein the generating the one or more factorial packed codewords incorporates Huffman Coding.

12. A method for factorial packed coding comprising:
splitting a first $C\pi$ into a $C\pi$ most significant bits part (MSP) and a $C\pi$ least significant bits part (LSP);
splitting a first $C\mu$ into a $C\mu$ MSP and a $C\mu$ LSP;
combining the $C\pi$ MSP and the $C\mu$ MSP from one or more factorial packed codewords into a first group;
concatenating the $C\pi$ LSP and the $C\mu$ LSP with $C\sigma$ from the one or more factorial packed codewords to produce a second group; and
combining the first group and the second group with a $Cv$ to form an error robust factorial packed codeword.

13. The method of claim 12, further comprising selecting a bit-length of a LSP such that the minimum value of the power term over the one or more factorial packed codewords is maximized without increasing the bit-length of the combined codeword.

14. The method of claim 12, wherein the combining further comprises:
calculating a maximal value for the $C\pi$ MSP and the $C\mu$ MSP for the plurality of factorial packed codewords; and
multiplying together the maximal values of the plurality of factorial packed codewords to produce a first portion of $Cv$.

15. The method of claim 14, wherein the first portion of $Cv$ is multiplied by a power term of 2 to left shift the value of $Cv$ by a number of bits corresponding to the bit-length of the second group.

16. The method of claim 15, wherein the power term further includes a bit-length of the $C\pi$ LSP and a bit-length of the $C\mu$ LSP.

17. The method of claim 12, wherein the splitting the first $C\pi$ and the splitting the first $C\mu$ to produce $Cv$ is dependent on the number of non-zero pulse positions.

18. The method of claim 12, further comprising selecting a bit-length of a MSP to produce a bit-length of the combined codeword that is equal to the bit-length of a factorial packed codeword.

19. The method of claim 12, further comprising a bit-length of a LSP that does not increase the bit-length of the combined codeword.

20. A system for coding a bit sequence comprising:
a splitter for splitting a first codeword into a most significant bits part (MSP) and a least significant bits part (LSP);
a combiner for combining the MSP of the first codeword with a second codeword to produce a first group; and
a concatenator for concatenating the first group with the LSP to produce a second group, and multiplexing the first group with the second group to produce a multiplexed codeword.

21. The system of claim 20, further comprising:
an error protection encoder for adding a first error protection code to the first group and a second error protection code to the second group, wherein a higher proportion of error protection is applied to the first group than the second group; and
an error protection decoder unit for removing a first error protection code to the first group and a second error protection code to the second group, wherein a higher proportion of error protection is applied to the first group than the second group.

22. The system of claim 20, further comprising a decoder for
de-splitting the multiplexed codeword into the first group and the second group, wherein the second group consists of one or more LSPs;
de-combining the first group into the one or more MSPs;
concatenating the one or more MSPs with the one or more LSPs to produce the one or more codewords.

* * * * *